United States Patent [19]

Dikken et al.

[11] Patent Number: 4,967,103
[45] Date of Patent: Oct. 30, 1990

[54] INTEGRATED LOGIC CIRCUIT WITH PROTECTOR TRANSISTOR

[75] Inventors: Jan Dikken; Roelof H. W. Salters, both of Eindhoven, Netherlands

[73] Assignee: U.S. Philips Corp., New York, N.Y.

[21] Appl. No.: 295,714

[22] Filed: Jan. 10, 1989

[30] Foreign Application Priority Data

Feb. 1, 1988 [NL] Netherlands .................. 8800236

[51] Int. Cl.$^5$ ............................................. H03K 17/04
[52] U.S. Cl. .................................. 307/296.5; 307/451; 307/548; 307/264
[58] Field of Search ............... 307/448, 451, 542, 544, 307/547–548, 584–585, 270, 443, 482, 578, 246, 296.5, 264; 361/87, 98

[56] References Cited

U.S. PATENT DOCUMENTS

| | | | |
|---|---|---|---|
| 4,178,620 | 12/1979 | Yu | 361/98 |
| 4,612,466 | 9/1986 | Stewart | 307/585 |
| 4,736,117 | 4/1988 | Wieser | 307/488 |
| 4,767,950 | 8/1988 | Schrenk | 307/264 |

FOREIGN PATENT DOCUMENTS

| | | | |
|---|---|---|---|
| 0115730 | 9/1980 | Japan | 307/448 |
| 0178015 | 8/1987 | Japan | 307/448 |

Primary Examiner—Stanley D. Miller
Assistant Examiner—Terry D. Cunningham
Attorney, Agent, or Firm—Steven R. Biren

[57] ABSTRACT

The invention relates to an additional transistor which is connected in cascode with a sub-circuit of a logic circuit in order to protect further transistors of the sub-circuit against hot carrier stress and hot carrier degradation. In a logic circuit having transistors of a first conductivity type, an additional transistor of the second conductivity type is arranged in cascode. This additional transistor is connected as a diode or as a current source in dependence on an output voltage of the circuit. Further aspects of the invention concern the switching means for switching the additional transistor and the location where the additional transistor is to be inserted.

10 Claims, 1 Drawing Sheet

| 4,967,103 |
|---|

INTEGRATED LOGIC CIRCUIT WITH PROTECTOR TRANSISTOR

BACKGROUND OF THE INVENTION

The invention relates to an integrated logic circuit, comprising a first sub-circuit which is arranged in a first path between a first power supply line, which carries a high supply voltage and an output of the circuit, and a second sub-circuit which is arranged in a second path between the output and a second power supply line which carries a low supply voltage, a current channel of at least one additional transistor being arranged in at least one of the paths in order to limit detrimentally strong electric fields in a further transistor of the sub-circuit in the relevant path.

A logic circuit of this kind is known from Netherlands Patent Application 8400523. In order to protect an N-channel field effect transistor in the second sub-circuit, arranged between an output junction point and the second power supply line carrying a low supply voltage, an additional N-channel field effect transistor is connected in cascode with the former transistor in the known logic circuit. The control electrode of the additional transistor is connected to the first power supply line carrying the high supply voltage. Thus, a voltage which is at most equal to the difference between the high and the low supply voltage, minus a threshold voltage of the additional transistor, will be present across the protected transistor. This reduces the risk of so-called hot carrier stress and hot carrier degradation caused by strong electric fields inside a transistor which are due to a high voltage across the transistor. As the dimensions o the transistors are smaller, these problems are more significant. When an N-channel field effect transistor in the first sub-circuit in a logic circuit is protected in the same way, the cascode connection of an additional N-channel field effect transistor gives rise to the problem that, when the first sub-circuit is conductive, a dissipating load connected to the outPut cannot be raised to a sufficientlY high logic level. This is because the two N-channel transistors are pinched increasingly further as the outPut voltage increases. Increasing the size of the transistors, therefore, does not make sense

SUMMARY OF THE INVENTION

It is an object of the invention to provide a logic circuit which includes a protective additional transistor which does not limit the logic high level to be formed.

To achieve this, a logic circuit in accordance with the invention is characterized in that the additional transistor is connected in series with the further transistor and is of a conductiVity type opposite to that of the further transistor, which series connection is arranged in one of the two paths, these being provided switching means for switching the additional transistor either as a diode or as a current source in dependence on changes of the logic state on the output of the logic circuit. The additional transistor for protecting the further transistor in the one path is connected as a current source when the other path changes over from the conductive to the blocked state. Because of the described choice of the type of conductivity, the additional transistor will not be pinched when a voltage thereacross decreases. The additional transistor is connected as a diode when the other path changes over from the blocked to the conductive state. This change-over induces an increasing voltage across the further transistor, giving rise to hot carrier stress. By connecting the additional transistor as a diode, the voltage present across the further transistor is reduced by a threshold voltage.

An embodiment of a logic circuit in accordance with the invention is characterized in that transistors in said sub-circuits are field effect transistors of the same conductivity type, which transistors are connected directly to the output, the current channel of the at least one additional transistor of the opposite conductivity type being connected between the relevant power supply line and the relevant sub-circuit. When the voltage on an output of a circuit, whereto field effect transistors of different conductivity type are connected, increases beyond the high supply voltage or when the output voltage of such a circuit drops below the low supply voltage, charge is injected to the well oz the substrate from a diffusion connected to the outPut of an associated field effect transistor. This gives rise to latch-up phenomena. This problem is at least halved when field effect transistors of only the same conductivity type are connected to the output.

A further embodiment of a logic circuit in accordance with the invention is characterized in that the switching means connect the additional transistor as a diode when a voltage across the relevant sub-circuit increases and a current through the further transistor in the relevant sub-circuit is substantiallY independent of a voltage across the further transistor. The voltage variation induced by the switching of the additional transistor is thus prevented from causing a current peak which changes the state of the circuit via parasitic inductances.

Another embodiment of a logic circuit in accordance with the invention is characteriZed in that the switching means gradually connect the additional transistor as a current source when a voltage across the relevant sub-circuit decreases, a current through the further transistor in the relevant sub-circuit being dependent on the voltage across the further transistor. The additional transistor may not be prematurely driven to full output because of the risk of hot carrier stress. Such driving should take place gradually, because in accordance with said condition the voltage across the further transistor determines the current conducted. If the voltage across the further transistor were to be increased too abruptly, current peaks would arise which could change the logic state o: the circuit Via parasitic inductances.

A preferred embodiment of a logic circuit in accordance with the invention is characterized in that the switching means comprise a first switching transistor having a current channel connected between a control electrode of the additional transistor and a main electrode of the additional transistor in order to connect the additional transistor as a diode, a second switching transistor, having a current channel connected between the control electrode of the additional transistor and a relevant power supply line in order to connect the additional transistor as a current source, and a feedback circuit which feeds back the output of the circuit to the control electrodes of the switching transistors in order to switch the switching transistors in dependence on the output voltage. The output voltage thus co-determines for a voltage across and a current through the relevant further transistor. The instant of switching of the additional transistor is determined by the output voltage.

A further embodiment of a logic circuit in accordance with the invention is characterized in that, when the additional transistor is of the second conductivity type, the first and the second switching transistor ar of the second and the first conductivity type, respectively, and in that, when the additional transistor is of the first conductivity type, the first and the second switching transistor are of the first and the second conductivity type, respectively. When use is made of switching transistors of the ProPosed conductivity types, threshold voltage losses are avoided.

A practical embodiment of a logic circuit in accordance with the invention is characterized in that the first switching transistor is substantially larger than the second switching transistor. The small second switching transistor conducts a small current which is necessary to drive the additional transistor gradually to full output as described above. The large first switching transistor conducts a large current which is necessary to enable fast switching over of the additional transistor from current source to diode. As has already been stated, this must take place when the current through the further transistor in the relevant sub-circuit is substantially independent of the voltage across the relevant transistor in the case of an increasing voltage across the relevant sub-circuit. For example, when a field effect transistor is used as the further transistor this means that the switching to the diode function must take place after saturation of the field effect transistor but before the drain-source voltage exceeds the limit beyond which hot carrier stress occurs. Therefore, this switching should take place sufficiently quickly.

Another embodiment of a logic circuit in accordance with the invention is characterized in that the feedback circuit comprises a non-inverting buffer between the output of the circuit and a control electrode of at least one of the switching transistors. By fixing a transition point of the buffer, the instant at which the at least one switching transistor becomes conductive can be determined in dependence on the output voltage of the circuit for a given outPut load

BRIEF DESCRIPTION OF THE DRAWING

The invention will be described in detail hereinafter with reference to an embodiment of a logic circuit in the form of a push pull stage as shown in FIG. 1, the single FIG. of the drawing.

DESCRIPTION OF THE PREFERRED EMBODIMENTS

Figure 1:
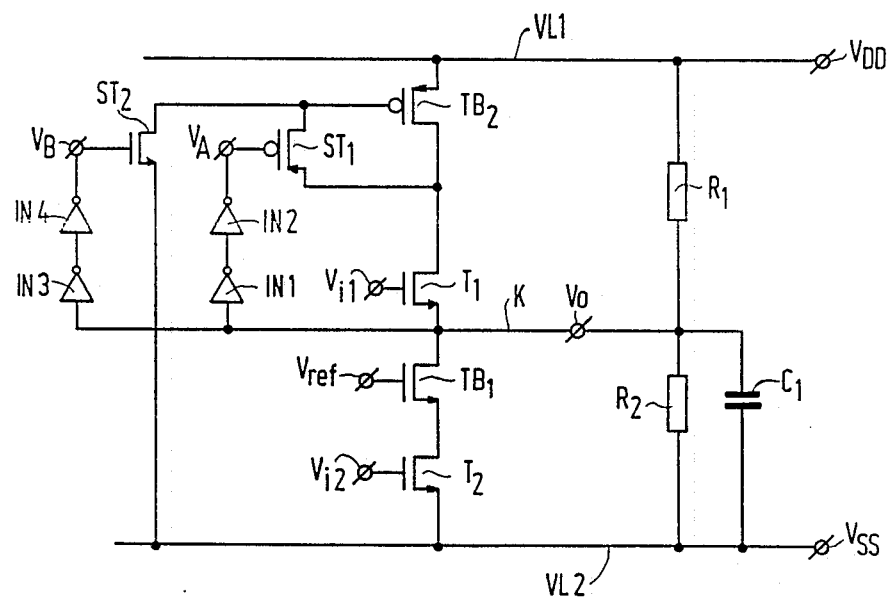

The drawing shows a logic circuit in accordance with the invention in the form of a push pull stage comprising N-channel field effect transistors T1 and T2 which form the push transistor and the pull transistor, respectively, of the stage and whose respective control electrodes receive input voltages Vi1 and Vi2. A load on the output K of the stage having the output voltage Vo is represented by resistances R1 and R2 and a capacitance C1. Such a load may be, for example an input of a TTL circuit. An N-channel field effect transistor T81 is arranged in cascode with the pull transistor T2 in order to avoid hot electron stress effects. The control electrode of the transistor TB1 is usually connected to a reference voltage $V_{ref}$ equal to $V_{DD}$. The maximum voltage then occurring across the transistor T2 amounts to $V_{DD}$-$V_{SS}$, minus a threshold voltage of the transistor TB1. If the push transistor T1 were also protected by means of an N-channel field effect transistor connected in cascode therewith, problems would arise when the output voltage Vo is increased to a logic high level. In that case the push transistor T1 as well as the protection transistor connected in cascode therewith is pinched further as the voltage Vo increases, because the control voltage (gate voltage minus source voltage) of both transistors decreases. This inhibits the deliverY of a sufficientlY large current for a sufficiently high outPut voltage (for examPle, at $v_{DD}$-$V_{TH}$). In order to mitigate this problem and still protect the push transistor T1 against hot electron stress, an additional transistor TB2 is connected in cascode with the push transistor T1, which additional transistor is of the P-channel field effect tYPe. This additional transistor T82 is connected as a diode, via the first switching transistor ST1, when the output voltage Vo decreases and hence the voltage across the push transistor T1 increases. When the output voltage Vo increases the push transistor T1 is connected as a current source via the second switching transistor ST2. In order to illustrate the basic idea, an initial state is assumed in which the output voltage Vo is logic high. The input voltage Vi1 is then logic high and the input voltage Vi2 is logic low. This blocks the first switching transistor ST1 whose control electrode is coupled to the output K via a non-inverting circuit which is represented herein by a cascade of inverter circuits IN1 and IN2. The second switching transistor ST2 whose control electrode is similarly coupled to the output K, Via inverter circuits IN3 and IN4, is conducted. In this state the additional transistor TB2 is connected as a current source because its control electrode is connected to the low supply voltage $V_{SS}$.

The changing of the output voltage Vo from logic high to logic low is initiated by changing the input voltage vi2 from logic low to logic high. The input voltage Vi1 then is kept brieflY logic high. If the input voltage Vi1 were made logic low before the input voltage Vi2 increases, the circuit would be slow A simultaneous change of the input voltages would cause substantial current variations which would cause interfering voltages on the power supply lines VL1 and VL2 due to the presence of parasitic inductances (not shown). The pull transistor T2 thus becomes conductive while the push transistor T1 is still conductive. Because the output voltage Vo then decreases, the voltage across the still conductive push transistor T1 increases, so that the latter transistor is saturated. The current through the push transistor T1 is then substantially independent of the voltage across this transistor. Before hot electron stress occurs in the push transistor T1, the additional transistor TB2 must be switched over from current source to diode in order to create an additional voltage drop limiting the voltage across the push transistor T1. This must take place quickly; therefore, the first switching transistor ST1 is a large transistor so that a large amount of charge can flow from the drain to the control electrode of the additional transistor TB2 within a brief period of time. By adjustment of the transition point of the inverter circuit IN1, the instant at which the first switching transistor ST1 becomes conductive can be fixed. Similarly, the transition Point of the inverter circuit IN3 determines the instant at which the second switching transistor ST2 is blocked. Furthermore, the first switching transistor ST1 is of the P-channel field effect type, so that it charges the control electrode of the additional transistor TB2 to its drain voltage without threshold loss. The input voltage Vi1 then decreases, thus blocking the push transistor T1. The output Vo has thus become logic low.

In order to increase the output voltage Vo from logic low to logic high, the push transistor T1 is rendered conductive by means of a logic high input signal Vi1 before the pull transistor T2 is blocked by a logic low input signal Vi2. As already has been stated, this sequence is chosen so as to reduce disturbing inductive voltages. The additional transistor TB2 must now be connected as a current source. This is realized by rendering the second switching transistor ST2 conductive and by blocking the first switching transistor ST1. The push transistor T1 then enters the linear range in which the current conducted by the transistor is dependent on a voltage thereacross. Excessively fast activation on of the additional transistor TB2 as a current source would cause an excessively fast current variation, giving rise to interfering voltages via the Parasitic inductances. ConsequentlY, the additional transistor TB2 is gradually activated as a current source. This happens gradually when the second switching transistor ST2 is a small transistor, so that per unit of time only a small amount of charge can be drawn from the control electrode of the additional transistor TB2. The instant of activation on of the additional transistor TB2 as a current source is co-dependent on the transition point of the inverter circuit IN3 and of the size of the second switching transistor ST2.

What is claimed is:

1. An integrated logic circuit comprising: a first output subcircuit which is coupled in a first path between a first power supply line, which carries a high supply voltage, and an output of the circuit, and a second output sub-circuit which is coupled in a second path between the output and a second power supply line which carries a low supply voltage, a current channel comprising an at least one transistor coupled in at least one of the paths in order to limit detrimentally strong electric fields in a further transistor of an output sub-circuit in said at least one of the paths, the at least one transistor being connected in series with the further transistor and being of a conductivity type opposite to that of the further transistor, said series connection being coupled in said at least one of the paths, and further comprising connecting means for connecting the at least one transistor as a diode or a current source as a function of changes int he logic state of the logic circuit.

2. An integrated logic circuit as claimed in claim 1, characterized in that the further transistor in said output sub-circuit in said at least one of the paths is a field effect transistor of a same conductivity type, said further transistor being connected directly to the output, the current channel of the at least one transistor of the opposite conductivity type being connected between its respective power supply line and the output sub-circuit in said at least one of the paths.

3. An integrated logic circuit as claimed in claim 1 or 2, characterized in that the connecting means connect the at least one transistor as a diode when a voltage across the output sub-circuit in said at least one of the paths increases and a current through the further transistor in the output sub-circuit in said at least one of the paths is substantially independent of a voltage across the further transistor.

4. An integrated logic circuit as claimed in claim 1 or 2, characterized in that the connecting means gradually connect the at least one transistor as a current source when a voltage across the output sub-circuit in said at least one of the paths decreases, a current through the further transistor in the output sub-circuit in said at least one of the paths being dependent on the voltage across 5. An integrated logic circuit as claimed in claim 1 or 2, characterized in that the connecting means comprise a first switching transistor having a current channel connected between a control electrode of the at least one transistor and a current channel electrode of the at least one transistor in order to connect the at least one transistor as a diode, a second switching transistor having a current channel connected between the control electrode of the at est one transistor and one of the power supply lines in order to connect the at least one transistor as a current source, and a feedback circuit coupled between the output of the circuit and the control electrode of at least one of the switching transistors in order to switch the switching transistors a function of an output voltage.

6. An integrated logic circuit as claimed in claim 5, characterized in that, when the at least one transistor is of the opposite conductivity type, the first and the second switching transistor are of the opposite and the same conductivity type, respectively, as that of the further transistor and in that, when the at least one transistor is of said same conductivity type, the first and the second switching transistor are of said same and said opposite conductivity type, respectively.

7. An integrated logic circuit as claimed in claim 5, characterized in that the first switching transistor is substantially larger than the second switching transistor.

8. An integrated logic circuit as claimed in claim 6, characterized in that the feedback circuit comprises a non-inverting buffer between the output of the circuit and the control electrode of at least one of the switching transistors.

9. An integrated logic circuit as claimed in claim 8, characterized in that, when the first switching transistor is of the opposite conductivity type as that of the further transistor, the buffer coupled thereto has a transition point near a minimum level of the output voltage and, when the first switching transistor is of the first conductivity type the buffer coupled thereto has a transition point near a maximum level of the output voltage.

10. An integrated logic circuit as claimed in claim 1 or 2 wherein said logic circuit comprises a push pull stage.

* * * * *